United States Patent
Meinders et al.

(10) Patent No.: US 8,570,491 B2
(45) Date of Patent: Oct. 29, 2013

(54) SYSTEM FOR PATTERNING FLEXIBLE FOILS

(75) Inventors: Erwin Rinaldo Meinders, Veldhoven (NL); Maria Peter, Eindhoven (NL); Peter Theodorus Maria Giesen, Geldrop (NL); Wilhelmus Johannes Maria de Laat, Heeswijk Dinther (NL)

(73) Assignee: Nederlandse Organisatie voor Toegepast-Natuurwetenschappelijk Onderzoek TNO, Delft (NL)

( * ) Notice: Subject to any disclaimer, the term of this patent is extended or adjusted under 35 U.S.C. 154(b) by 347 days.

(21) Appl. No.: 12/919,966

(22) PCT Filed: Feb. 27, 2009

(86) PCT No.: PCT/NL2009/050088
§ 371 (c)(1),
(2), (4) Date: Mar. 1, 2011

(87) PCT Pub. No.: WO2009/108054
PCT Pub. Date: Sep. 3, 2009

(65) Prior Publication Data
US 2011/0261336 A1    Oct. 27, 2011

(30) Foreign Application Priority Data
Feb. 27, 2008  (EP) .................................. 08152032

(51) Int. Cl.
*G03B 27/58*   (2006.01)
*G03B 27/42*   (2006.01)
*G03B 27/32*   (2006.01)
*G03F 7/20*    (2006.01)
*B23Q 3/154*   (2006.01)

(52) U.S. Cl.
CPC .............. *G03F 7/707* (2013.01); *B23Q 3/1546* (2013.01); *G03F 7/70758* (2013.01); *G03F 7/70783* (2013.01)
USPC ................... 355/72; 355/53; 355/64; 361/145

(58) Field of Classification Search
CPC . G03F 7/70708; G03F 7/707; G03F 7/70758; G03F 7/70783; H01L 21/6831; B23Q 3/1546
USPC ................... 355/53, 64, 72, 73; 361/234, 145
See application file for complete search history.

(56) References Cited

U.S. PATENT DOCUMENTS 4,385,434 A * 5/1983 Zehnpfennig et al. ....... 29/281.1
4,475,223 A   10/1984 Taniguchi
(Continued)

FOREIGN PATENT DOCUMENTS

EP   0350235    1/1990
JP   11504760   4/1999
(Continued)

*Primary Examiner* — Steven H Whitesell Gordon
(74) *Attorney, Agent, or Firm* — Maryellen Feehery Hank; Reed Smith LLP (57) ABSTRACT

According to one aspect, the invention provides a table for compensating deformation in flexible foils (1) The table comprises a supportive base (2) and a deformation compensation system (3). This system comprises a plurality of movable elements (4), supported by the base (2), wherein the movable elements form a surface for supporting the flexible foil. The movable elements comprise clamps (6) for clamping the foil (5). The movable elements (4) are individually movable parallel to the surface for supporting the foil, so as to stretch the clamped foil into a predefined shape. The table for compensating deformation in flexible foils may be used in a manufacturing process of flexible functional foils to compensate deformation of the foils during sequential patterning.

19 Claims, 7 Drawing Sheets

(56) References Cited

U.S. PATENT DOCUMENTS

| | | | |
|---|---|---|---|
| 5,075,718 A * | 12/1991 | Suzuki et al. | 355/50 |
| 5,198,857 A * | 3/1993 | Goto | 355/53 |
| 5,652,645 A * | 7/1997 | Jain | 355/53 |
| 6,243,160 B1 * | 6/2001 | Takano | 355/75 |
| 6,700,643 B2 * | 3/2004 | Mimura et al. | 355/53 |
| 6,847,433 B2 * | 1/2005 | White et al. | 355/72 |
| 7,969,553 B2 * | 6/2011 | Sato et al. | 355/64 |
| 2004/0080734 A1 * | 4/2004 | Taniguchi et al. | 355/53 |
| 2005/0067094 A1 | 3/2005 | Chen | |
| 2006/0066715 A1 * | 3/2006 | Fukui | 347/262 |
| 2008/0094465 A1 * | 4/2008 | Okutsu | 347/248 |
| 2009/0059195 A1 * | 3/2009 | Sato et al. | 355/53 |
| 2009/0128789 A1 * | 5/2009 | Sato et al. | 355/53 |
| 2011/0013162 A1 * | 1/2011 | Kiuchi et al. | 355/53 |

FOREIGN PATENT DOCUMENTS

| | | |
|---|---|---|
| JP | 2004172319 | 6/2004 |
| JP | 3815687 | 8/2006 |
| JP | 2007331041 | 12/2007 |
| JP | 2008033359 | 2/2008 |

* cited by examiner

SYSTEM FOR PATTERNING FLEXIBLE FOILS

RELATED APPLICATIONS

This application is the United States National Stage of International Application No. PCT/NL2009/050088, filed Feb. 27, 2009, which was published as International Publication No. WO 2009/108054, and which claims benefit of European Patent Application No. 08152032.2 filed Feb. 27, 2008. Both applications are incorporated by reference in their entirety herewith.

FIELD OF INVENTION

The invention relates to a system and method for patterning flexible foils.

DESCRIPTION OF PRIOR ART

The present invention relates to the field of patterning flexible foils. One application of patterning flexible foils is to create flexible foils with an electric function, like a display foil, a battery foil or a solar panel foil. These foils may be used as building blocks for multi-foil systems, i.e. flexible laminated electronic systems. These multi-foil systems have numerous applications, e.g. in the fields of lighting and reusable and disposable sensor devices.

Functional foils are manufactured by sequentially adding and patterning layers on the foil. This manufacturing process is reminiscent to the manufacturing of conventional electronic components, e.g. computer chips. There is however a difference between manufacturing solid electrical components and manufacturing flexible functional foils, in that during lithographic patterning processes (like mask based illumination, mask less illumination or laser patterning), the various steps of cleaning, layer deposition, heating, etching, handling or storage may cause flexible functional foils to deform. Deformation may result in overlay errors in the stack of patterned layers.

Therefore, in one aspect, the present invention aims to provide a system and method to compensate for the deformation of flexible foils during sequential patterning.

It is noted that a system for deforming a wafer is known from prior art (Taniguchi et al., U.S. Pat. No. 1,475,223). However in this publication, the system deforms the wafer such that a constant spacing is kept between the wafer and a deformed mask, the so called out of plane deformation. The challenges in compensating for deformation of a flexible foil significantly differ from deforming a solid wafer, since besides out of plane deformation corrections, also so called in plane deformation corrections are needed.

For cost saving reasons, it is preferred that the individual foils are manufactured in large sizes and quantities, e.g. rolls with many meters (hundreds of meters) of foil.

Therefore, in another aspect, the invention aims to provide a system and method for patterning flexible foils that may he used in a reel-to-reel (also said roll-to-roll) manufacturing process, as well in a batch-wise manufacturing process.

DISCLOSURE OF THE INVENTION

According to one aspect, the invention provides a table for compensating deformation in flexible foils, comprising a supportive base and a deformation compensation system, the deformation compensation system comprising a plurality of movable elements supported by said base; the movable elements forming a surface for supporting the flexible foil; the movable elements comprising clamps for clamping the foil, characterized in that the movable elements are individually movable parallel to the surface for supporting the foil, so as to stretch the clamped foil into a predefined shape.

According to another aspect, the invention provides a method of patterning a flexible foil, using a system for patterning flexible foils, said system comprising a table for compensating deformation in said foil, said table comprising a supportive base and a deformation compensation system, the deformation compensation system comprising a plurality of movable elements supported by said base, the movable elements forming a surface for supporting the foil, the movable elements comprising clamps for clamping the foil, the method comprising the steps of providing a foil; clamping the foil to the movable elements; individually moving the movable elements parallel to the foil, so as to stretch the foil into a predefined shape; and patterning the foil above the table.

The present invention will become more readily apparent from the following detailed description of the preferred embodiments of the present invention taken in conjunction with the accompanying drawings.

DESCRIPTION OF THE EMBODIMENTS

Figure 1A:
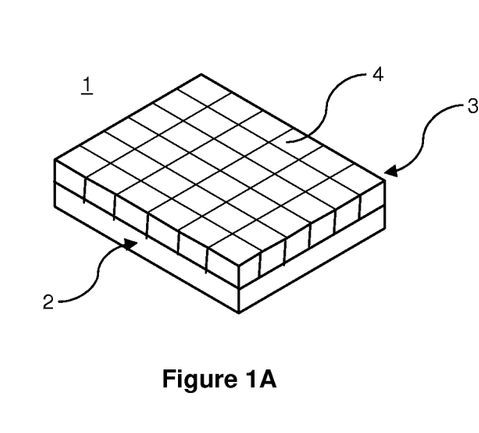
FIG. 1: Schematic overview and exaggerated side view of a table for compensating deformation in flexible foils.
Figure 1B:
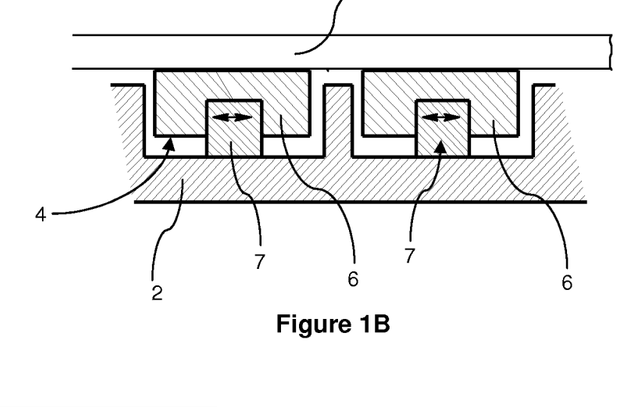

One aspect of the present invention is a table for compensating deformation in flexible foils 1. FIG. 1A shows a schematic overview of an embodiment, of such a table. In this embodiment, the table comprises a supportive base 2 and a deformation compensation system 3. The deformation compensation system comprises a grid of movable elements 4, supported by said base. The movable elements 4 form a surface for supporting the flexible foil 5. In FIG. 1B, an exaggerated side view of the table, it can be seen that the movable elements 4 comprise clamps 6 for clamping the foil 5. The movable elements 4 are individually addressable and movable parallel to the surface for supporting the foil 5, so as to stretch the clamped foil 5 into a predefined shape.

The movable elements 4 in the grid are regularly distributed over substantially the whole surface of the table and spaced apart by gaps with a maximum distance in a range between 50 and 500 micrometers. In addition, for a 12 or 25 micrometers foil, the gap may also have a minimum distance, for example between 2 and 20 micrometers.

An indication of the size of the table 1 is 50 by 50 centimeters, although larger sizes may also be used like (approximately) 2.8 meter by 2.4 meter, which would conform to the so called Gen9 format in batch-wise display production.

An indication of the size of the movable elements 4 is 5 by 5 millimeters to 50 by 50 millimeters. in case the movement of the elements takes place in only one direction, the maximum length of an element may be the size of the table, while the width may be between 5 to 50 millimeters.

The movement of the movable elements 4 is provided by actuators 7, comprised in the movable elements 4. In this embodiment, the actuators 7 are mechanical actuators. However, in other embodiments, they may be driven by piezo-elements, by coils, by pneumatic means, by hydraulic means or by thermal means.

In this embodiment, the clamps 6 are magnetic clamps. In another embodiment the clamps 6 are vacuum clamps. The attraction force of the magnetic clamps may be individually addressed and adjusted in strength. Another advantage of magnetic clamping is that the possible speed of clamping and de-clamping is much higher than with vacuum clamping. These characteristics make the magnetic method especially suitable for on the flight overlay compensation, for stitching of images and for alignment, all important criteria for large area lithography on flexible substrates.

Figure 1C:
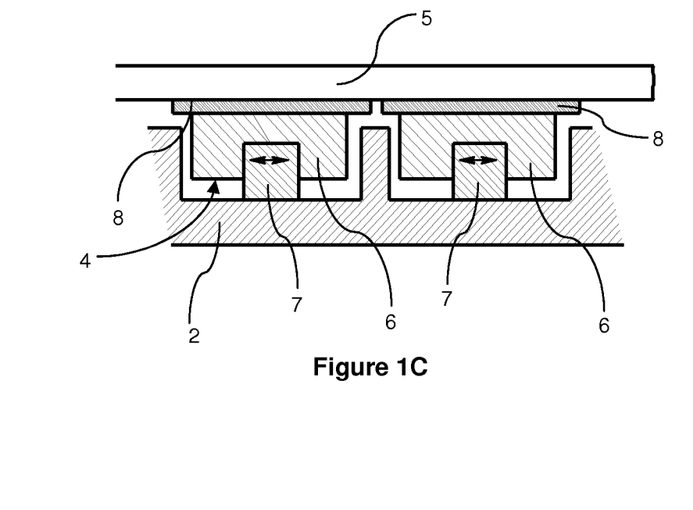

In another embodiment, shown in FIG. 1C, the movable elements 4 comprise adhesion-enhancing layers 8 to improve the adhesion between the foil 5 and the movable elements 4. One possibility to enhance the adhesion is to use friction-increasing layers. However, other ways of enhancing the adhesion, like using sticky layers are also contemplated. The friction enhancing layers are preferably of a dielectric (i.e. a non-magnetic) material.

The thickness of the individual adhesion enhancing layers may be used for compensating for differing heights of the movable elements, so as to planarize the foil supporting surface. Thus, by varying the height of the layers, height differences of the movable elements may be compensated for.

In the above, three possible constituents of the movable elements 4 are described: clamps 6, actuators 7 and adhesion enhancing layers 8. However, in other embodiments the constitution of the movable elements 4 may be different in that e.g. other constituents may be provided or previously described constituents may be left out.

The deformation in the clamped foil 5 may be compensated for by stretching the foil 5 into a predefined shape. Therefore, the movable elements 4 may be translated in two directions in a plane parallel to the surface supporting the foil 5. In another embodiment of the table, compensating for flatness is possible by moving the movable elements 4 in a third dimension, perpendicular to the surface supporting the foil 5. Rotations of the movable elements 4 around an axis of rotation parallel to the surface of the foil may also increase the flatness of the foil.

Figure 2A:
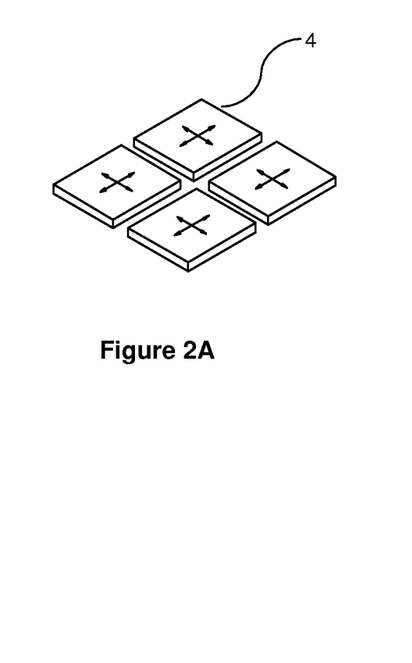
FIG. 2: Exemplary shapes of the movable elements for reducing sagging of the foil between the moveable elements.
Figure 2B:
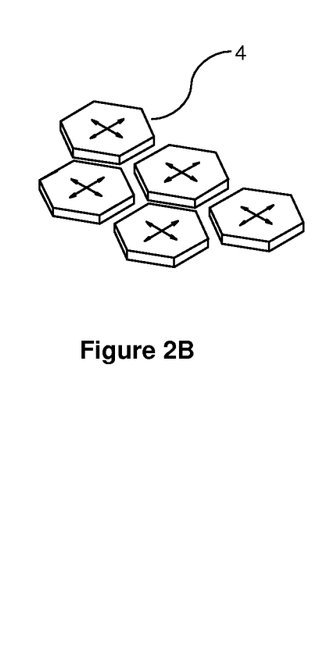
Figure 2C:
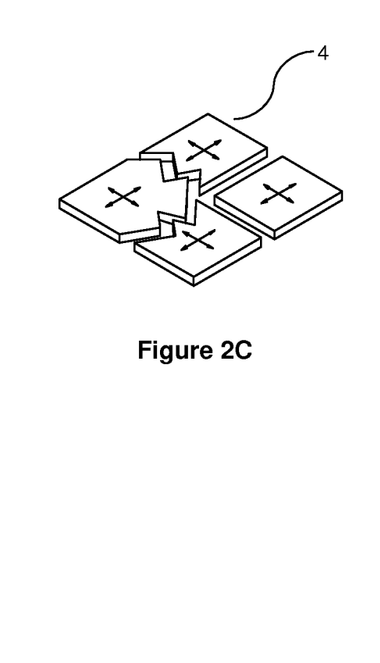

The shape of the movable elements 4 on the foil 5 supporting side may be chosen such that sagging of the foil 5 into the gaps between the elements is reduced. Exemplary shapes of the movable elements are shown in FIG. 2. The elements may be squared (FIG. 2A), hexagonal (FIG. 2B) or squared with a zigzag edge on engaging sides as shown in FIG. 2C.

The tendency of sagging of the foil basically depends on two aspects of the distribution of the movable elements 4 over the surface of the table 1: the width of the gap between the elements and the length of the gap, extending along (a number of) elements.

The tendency of sagging increases with increasing width of the gap between the movable elements. A foil with a certain bending radius will easier sag into the gap, when the width of the gap increases.

In addition, the tendency of sagging increases with an increasing length of the gap. Depending on the layout of the grid, the gap may extend along a multitude of movable elements. An increasing length of the gap advocates sagging of the foil into a single-curved surface. Single-curved surfaces are surfaces that are curved along a single axis. Single-curved bending is relatively easy because very little deformation occurs in the foil.

Decreasing the length of the gap forces the foil into so called double-curved bending. A double-curved surface is a surface that is curved along at least, two axes. Double-curved bending requires more foil deformation than single-curved bending and is therefore more difficult to achieve. Therefore, providing the elements with staggered edges prevents the gaps from extending in-line along a multitude of elements and minimizes sagging of the foil.

From FIG. 2A it can be seen that the layout of the grid of squared movable elements 4 provide gaps, extending along a number of elements, making single-curved bending relatively easy. Therefore, this pattern will be suitable for relatively thick foils (indicatively 200-500 micrometers).

When zigzags are provided on engaging sides of the square movable elements (FIG. 2C), the extension of the gap may locally be smaller than one side of the square, making this pattern especially suitable for relatively thin foils (indicatively 5-20 micrometers).

The configuration with the hexagonal elements in FIG. 2B shows that the length of the gap extends along one side of the hexagon. This length of the gap lies between the multitude of elements of the square configuration and the length of the gap between the zigzags and is therefore suitable for foils of an average thickness (indicatively 50-200 micrometers).

Figure 4A:
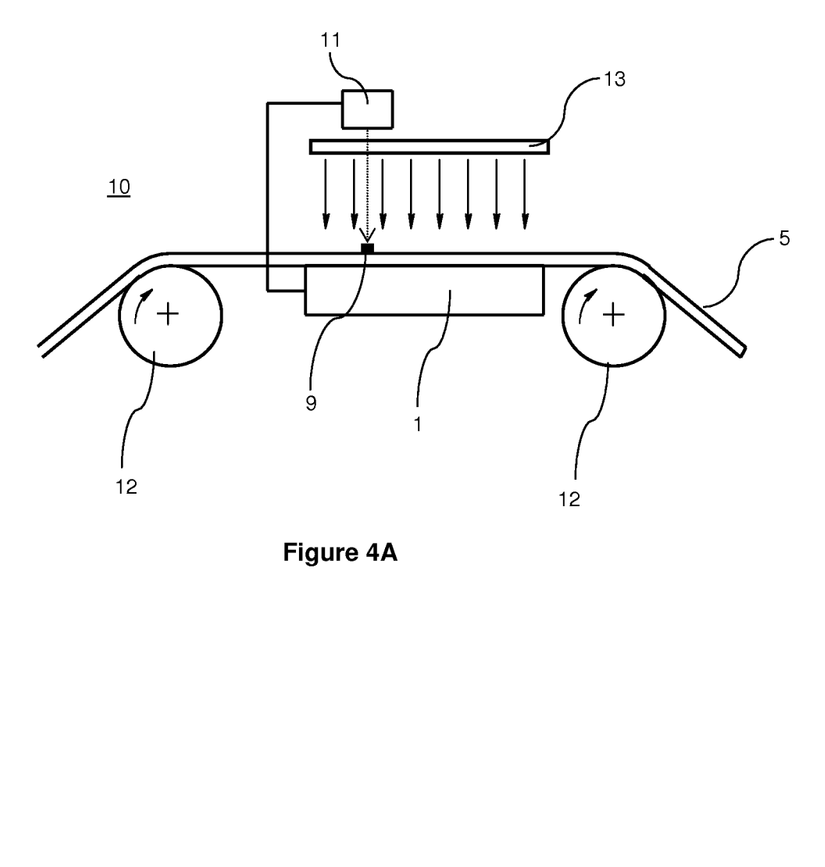
FIG. 4: Overview of a system for patterning flexible foils.

Another aspect of the present invention is a system 10 for patterning flexible foils 5. FIG. 4A shows an embodiment of this system. The system comprises the table for compensating deformation, as described above. The system further comprises transporting means for moving the foil 5 at least partly over the table. In the embodiment shown in FIG. 4A, the transporting means comprise two reels 12. Using reels as a transport mechanism makes the system compatible with roll-2-roll processing, so the table may be used to expose a part, of the foil while it is transported continuously (or in step mode).

Figure 4B:
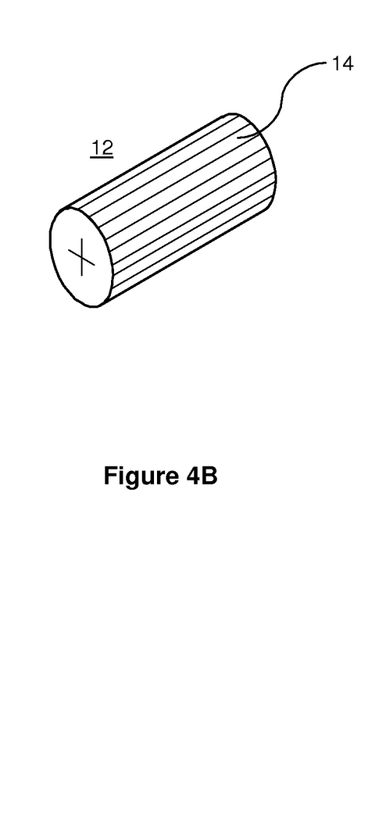

In one embodiment, at least one of said reels 12 comprises magnetic elements 14. This is shown in FIG. 4B. For controlling the transport of the foil 5, each element is individually addressable and the force of each magnetic element may be individually adjusted.

The individual magnetic elements 14 may be addressed such that a dynamic magnetic force is generated. The propagation speed of this magnetic wave is synchronized with the desired transportation velocity of the foil 5. In this manner, the foil 5 may be transported without turning the reels 12 ('static movement').

The system further comprises a patterning unit arranged for patterning the section of the foil 5 above the table. In the embodiment shown in FIG. 4A, the patterning unit comprises irradiating means 13. The irradiation may be lithographic or direct laser writing.

Figure 3A:
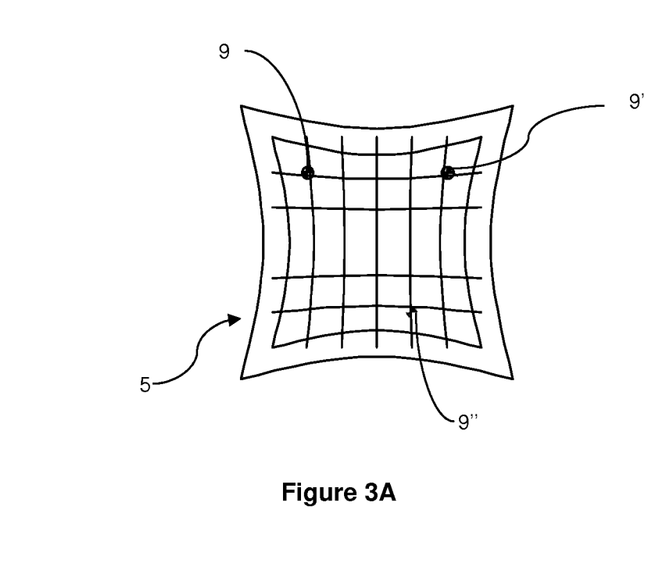
FIG. 3: Markers indicating deformation in the foil.

The system further comprises an alignment system 11, communicatively coupled to the deformation compensation system 3, responsive to output of the alignment system. (For convenience, the alignment system is only drawn once: in FIG. 4A. In one embodiment, the alignment system 11 is arranged to detect a marker pattern provided on the foil 5. For example, due to exposure, the foil 5 may be in a deformed state and the position of the alignment markers 9, 9', 9" comprised in the foil 5 and indicative of the deformation, is measured. The alignment markers 9, 9', 9" may also be comprised in a previously exposed and patterned layer. FIG. 3A shows the markers 9, 9', 9" in the foil 5 in a deformed state.

Figure 3B:
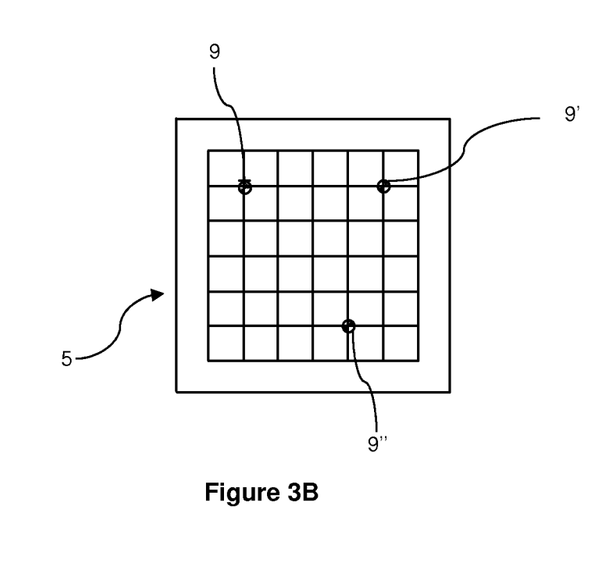

The alignment system 11 controls the deformation compensation system 3 by aligning the markers 9, 9', 9" measured in the deformed foil 5 with respect to a preferred marker pattern. The preferred marker pattern may be measured from the foil 5 in an undeformed state as shown in FIG. 3B. The preferred marker pattern may also be determined from the position of the markers 9, 9', 9" in the deformed state. This is e.g. feasible if the deformation is small compared to the spacing of the markers 9, 9', 9" in the preferred marker pattern.

The preferred marker pattern may be projected on the table.

To provide a foil 5 to the system, the system comprises a foil feed (not shown).

In one embodiment, the system may be operated in a stepwise manner. Via the transporting means, positioned before and after the exposure table, the relevant part of the foil 5 is transported over the table. During exposure, the foil 5 is clamped to the table. After exposure, a new port of the foil 5 may be transported to the table. In another embodiment, the system may be operated in a scanner-type of way. In this operating mode, the foil 5 and the irradiation means may be moving relative to each other and only the part of the foil 5 that is being irradiated is clamped by the table. This operating mode may be advantageous in three ways. First, the size of the image is not determined by the size of the imaging system. Second, the stitching of the images is minimized and third, a continuous process flow is possible. A direct laser patterning or maskless illumination system may be used to provide a continuous patterning system.

Figures 5, 5A, 5B, 5C:
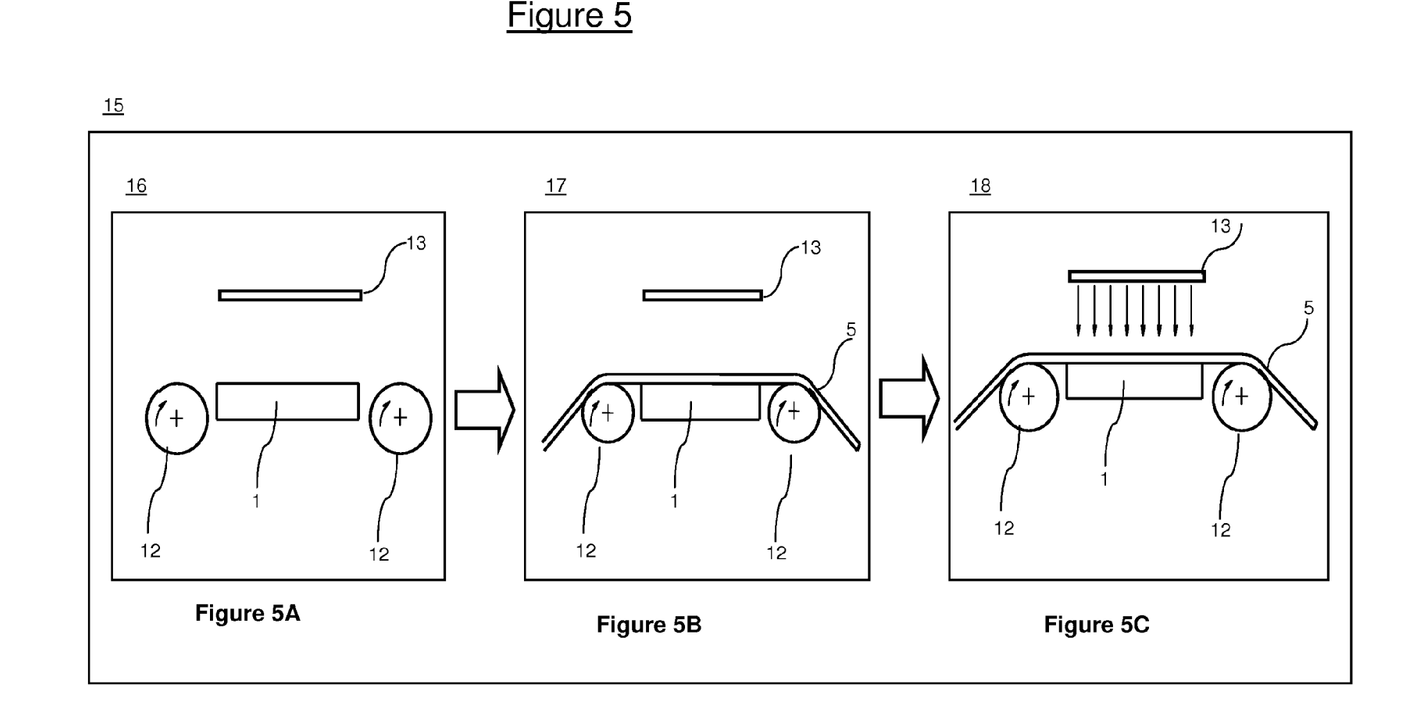
FIG. 5: Schematic representation of a method for patterning foils.
Figure 6A:
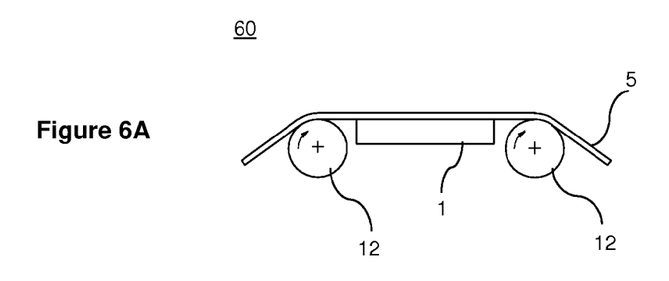
FIG. 6: Arrangements of a system for patterning foils to provide a good contact between the foil and the table.
Figure 6B:
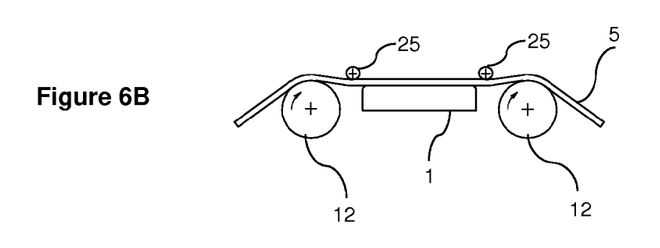
Figure 6C:
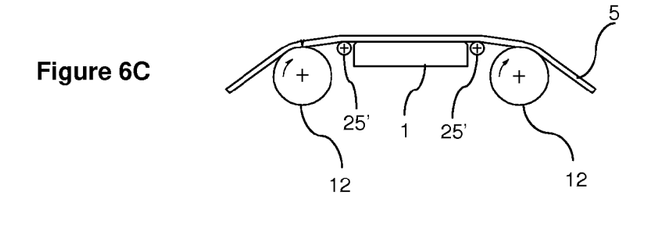
Figure 6D:
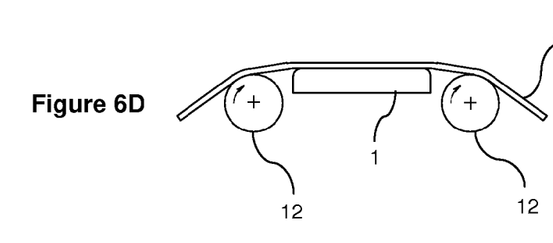
Figure 6E:
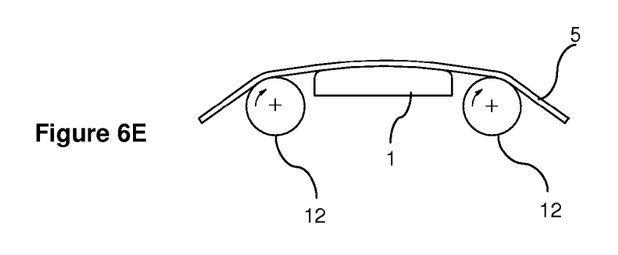

Yet another aspect of the present invention is a method of patterning a flexible foil 15 by using a system for patterning flexible foils 16. A schematic representation of this method is given in FIG. 5. The system comprises a table for compensating deformation in the foil 5, the table comprises a supportive base 2, a grid of movable elements 4 supported by the base, the movable elements 4 (not shown) forming a surface for supporting the foil 5, the movable elements 4 comprise clamps 6 for clamping the foil 5, the method comprises several steps. The method starts with the system without the foil 16 as shown in FIG. 5A. In the first step, see FIG. 5B, the foil feed provides a foil 5 to the system 17. In the second step, the foil 5 is clamped to the movable elements 4 and in step 3 the movable elements 4 are individually moved parallel to the foil 5, so as to stretch the foil 5 into a predefined shape (not shown). In step 4, FIG. 5C, the foil 5 is kept in the predefined shape, the exposure is executed and the foil is patterned above the table 18.

If the deformation of the foil 5 is not only in-line deformation, an extra step of moving the movable elements 4 perpendicular to the foil 5 to stretch the foil 5 into the predefined shape may be added to this method.

FIG. 6 shows a number of variants of a system 60 for patterning flexible foils being arranged to provide a pressed contact between the foil 5 and the table 1. In FIG. 6A, the table is in line with the foil 5 and thus the foil 5 is in contact with the table. FIG. 6B shows two assisting reels or guides 25 to guide the foil 5 to the table. Two more assisting guides 25' that provide a flat surface for the table 1 can be seen in FIG. 6C. The assisting guides may be rollers, but differently shaped guides are possible. In FIG. 6D, the edges of the table 1 form a guide or support for the foil 5. In FIG. 6E, the table surface is curved to provide the foil with supported contact. The curvature of the table may have different convex shapes like a cylindrical shape, a parabolic shape or a spherical shape. Also the size and the radius of the table may vary. In some cases it may be advantageous to provide a small table similar to a roll.

Figure 7A:
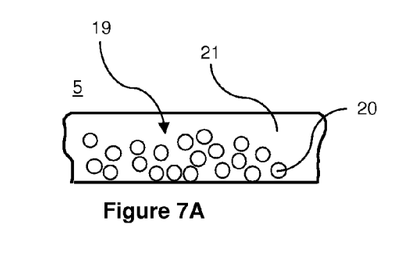
FIG. 7: Magnetic portions and particles in foils.
Figure 7B:
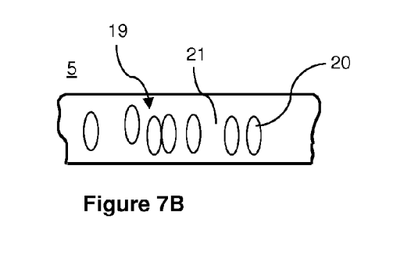
Figure 7C:
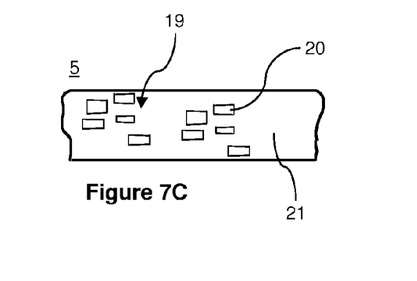
Figure 7D:
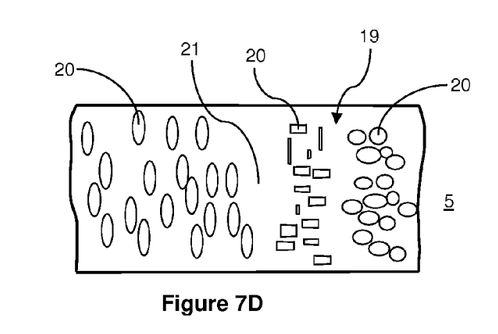

In one embodiment, the magnetic portion 19 of the foil 5 is formed by filling the foil 5 with magnetic or metal particles or fibres of particular shapes. FIG. 7 shows some exemplary shapes of particles, like circular or spherical (FIG. 7A), elliptical (FIG. 7B) and rectangular, needle-shaped or disk-shaped (FIG. 7C). A mixture of various shapes, as shown in FIG. 7D is also possible.

Different types of particle shapes may be used to:
optimize the production process;
provide anisotropy to control different clamping properties in various directions, e.g. to improve the properties in machine direction or transverse direction, or to improve the force parallel to the substrate;
increase conduction properties by orientation of long particles in the same direction;
improve the adhesion of the particles into the (polymer) foil.

The particles and/or fibres may be homogeneously spread through the foil 5, but they may also be spread along a certain (density) distribution. An example of a distribution is a distribution along the thickness direction, with decreasing density of particles at increasing distance to the side of the foil 5 nearest to the clamps 6. A higher dose of particles and/or fibres near the clamping side may provide a higher clamping force. A second advantage of concentrating particles on the clamping side is to provide an electrical isolation between the electronic device on the substrate and the particles in the substrate. An advantage of spreading the particles homogeneously within the foil may be an increase of the uniformity of the material properties of the foil.

Accordingly for operating the system magnetically, the foil 5 may comprise a magnetic portion 19. The characteristics of the magnetic portion 19 influence the possibilities to adjust the clamping force. Non-magnetic base material 21 of the foil 5 may be plastic, but may also be paper, composite material, glass, etc. The magnetic portion 19 may be provided in various ways.

Figure 7E:
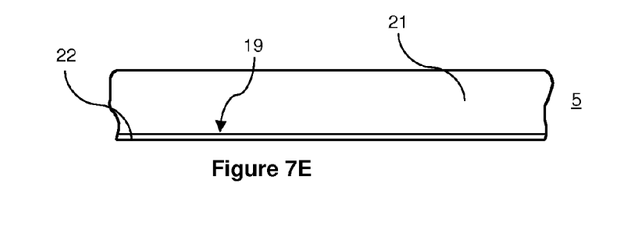
Figure 7F:
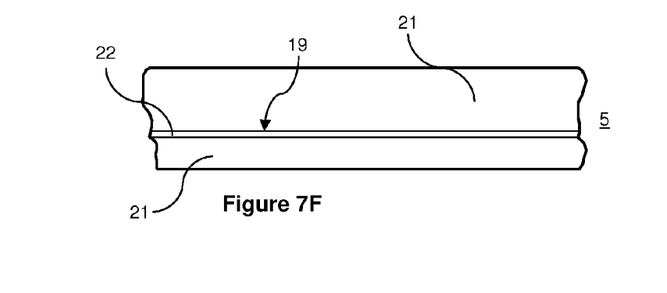

In another embodiment, the magnetic portion 19 of the foil 5 is formed by a magnetic or metal tape 22. This is shown in FIG. 7E. In FIG. 7F, the magnetic tape 22 is laminated with an extra foil 5. The magnetic tape 22 may be provided with a certain pattern, like stripes, squares, etc.

One advantage of providing magnetic particles 20 in the foil 5 is that the clamping force may be influenced by choosing a certain density of the particles. Another advantage of magnetic particles 20 in foils is that the magnetic particles 20 might provide a barrier for water/moisture in the foil.

Clamping the foil 5 magnetically to the table and to the reels 12 is advantageous compared to vacuum clamping. Among others, the clamping force is adjustable, so selective slip can occur, which will minimize the effect of discrete deformed areas. Another advantage is that switching the magnetic force on and off is faster and may be applied to the whole surface, contrary to vacuum clamping that is only possible near the vacuum holes. A disadvantage of vacuum clamping is that, in order to maintain a required pressure, air is to be removed from the clamps through vacuum holes. This causes spots with higher vacuum forces and therefore deformations of the substrate.

In case of magnetic clamping, holes or groves are provided in the clamps, to prevent air bubbles between the foil and the table.

The detailed drawings, specific examples and particular formulations given serve the purpose of illustration only. A further advantage of magnetic handling of a foil 5, compared to vacuum clamping, is that the use of perforated foils becomes feasible.

Furthermore, other substitutions, modifications, changes, and omissions may be made in the design, operating conditions, and arrangement of the exemplary embodiments without departing from the scope of the invention as expressed in the appended claims.

The invention claimed is:

1. A table for compensating deformation in flexible foils, comprising
    a supportive base; and
    a deformation compensation system, said deformation compensation system comprising a plurality of movable elements supported by the base, wherein said movable elements form a surface for supporting the flexible foil, said movable elements further comprising magnetic clamps for clamping the foil, wherein said movable elements are individually movable parallel to the surface for supporting the foil, so as to stretch the clamped foil into a predefined shape.

2. The table of claim 1, wherein the movable elements are regularly distributed over substantially the whole surface of the table, so as to form a grid of movable elements.

3. The table of claim 1, wherein the movable elements are spaced apart by gaps with a minimum distance in a range between 2 and 20 micrometers and a maximum distance in a range between 50 micrometers and 500 micrometers.

4. The table of claim 3, wherein the movable elements have staggered edges, to prevent the gaps from extending in-line along a multitude of elements and to minimize sagging of the foil.

5. The table of claim 1, wherein the movable elements further comprise actuators for moving the movable elements.

6. The table of claim 1, wherein the movable elements further comprise adhesion enhancing layers for improving the grip of the clamps on the foil.

7. The table of claim 6, wherein the adhesion enhancing layers are friction enhancing layers.

8. The table of claim 6, wherein a thickness of the individual adhesion enhancing layers compensates for differing heights of the movable elements, so as to planarize the foil supporting surface.

9. A system for patterning flexible foils, comprising
    a foil feed, for providing the foils;
    the table according to claim 1;
    transporting means for moving the foil at least partly over the table;
    a patterning unit arranged for patterning the section of the foil above the table; and
    an alignment system, communicatively coupled to the deformation compensation system, provided in the table.

10. The system of claim 9, wherein the alignment system is arranged to detect a marker pattern provided on the foil.

11. The system of claim 10, wherein the patterning unit comprises irradiating means.

12. The system of claim 9, wherein the transporting means comprise at least two reels, so as to be used in a reel-to-reel manufacturing process.

13. The system of claim 12, wherein at least one of said reels comprises a plurality of movable elements formed as magnetic elements, wherein each magnetic element is individually addressable for controlling the transport of the foil.

14. The system according to claim 13, wherein the patterning unit comprises irradiating means.

15. The system of claim 12, wherein the patterning unit comprises irradiating means.

16. The system of claim 9 wherein the patterning unit comprises irradiating means.

17. A method of patterning a flexible foil, using a system for patterning flexible foils, said system for patterning flexible foils comprising a table for compensating deformation in said foil, said table comprising a supportive base and a deformation compensation system, said deformation compensation system comprising a plurality of movable elements supported by the base, wherein said movable elements form a surface for supporting the flexible foils, said movable elements further comprising magnetic clamps for clamping the foil, the method comprising the steps of:
    providing a system for patterning flexible foils;
    providing a foil comprising a magnetic portion for clamping the foil magnetically;
    clamping the foil to the movable elements by said magnetic clamps;
    individually moving the movable elements parallel to the foil, so as to stretch the foil into a predefined shape; and
    patterning the foil above the table.

18. The method of claim 17, further comprising the step of individually moving the movable elements perpendicular to the foil to stretch the foil into the predefined shape.

19. The method of claim 17, wherein the magnetic portion comprises magnetic particles, to locally adjust the clamping force.

* * * * *

UNITED STATES PATENT AND TRADEMARK OFFICE
CERTIFICATE OF CORRECTION

PATENT NO.        : 8,570,491 B2                                                    Page 1 of 1
APPLICATION NO.   : 12/919966
DATED             : October 29, 2013
INVENTOR(S)       : Meinders et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 534 days.

Signed and Sealed this
Twenty-second Day of September, 2015

Michelle K. Lee
*Director of the United States Patent and Trademark Office*